United States Patent
Yang

[11] Patent Number: 5,844,248
[45] Date of Patent: Dec. 1, 1998

[54] CIRCUIT ARRANGEMENT INCLUDING PHOTOELECTRIC TRANSDUCERS FOR SUPPLYING A HIGH VOLTAGE DRIVING SIGNAL TO AN INSULATED GATE BIPOLAR TRANSISTOR

[76] Inventor: Tai-Her Yang, No. 32 Lane 29, Taipin St., Si-Hu Town, Dzan-Hwa, Taiwan

[21] Appl. No.: 807,738

[22] Filed: Mar. 4, 1997

[51] Int. Cl.[6] ................................................. G02B 27/00
[52] U.S. Cl. ...................... 250/551; 250/214.1; 327/434
[58] Field of Search .................................. 250/551, 205, 250/214 R, 214 LS, 214.1, 214 SW; 327/432–434, 514; 363/74–76, 80

[56] References Cited

U.S. PATENT DOCUMENTS 5,055,721 10/1991 Majumdar et al. ..................... 327/541
5,602,505 2/1997 Antone ..................................... 327/432

*Primary Examiner*—Que Le
*Attorney, Agent, or Firm*—Bacon & THomas, PLLC

[57] ABSTRACT

An insulated gate bipolar transistor (IGBT) is supplied with high voltage electric power by a power supply circuit that includes a plurality of photoelectric transducers arranged to output a high voltage, low current driving signal, and an illumination component optically coupled with the photoelectric transducers and supplied with low voltage electric power, thus allowing the insulated gate bipolar transistor to be used in low voltage applications that would otherwise result in a sudden increase in switch loss and burnout of the transistor.

10 Claims, 1 Drawing Sheet

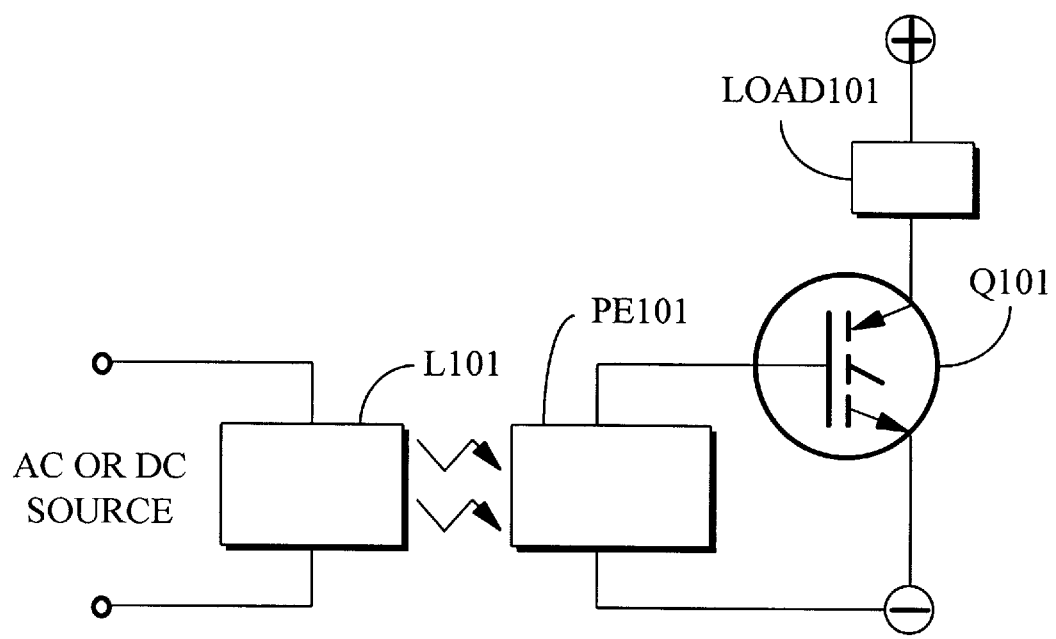
THE FIGURE

5,844,248

CIRCUIT ARRANGEMENT INCLUDING PHOTOELECTRIC TRANSDUCERS FOR SUPPLYING A HIGH VOLTAGE DRIVING SIGNAL TO AN INSULATED GATE BIPOLAR TRANSISTOR

BACKGROUND OF THE INVENTION

The insulated-gate bipolar transistor (IGBT) is a recently developed solid state power switching component which has a wide range applications due to its large switching capacity and convenience in usage. However, since the control end of the insulated-gate bipolar transistor (IGBT) has a high impedance, the matching driving signal must be a low current at a relatively high voltage. For example, the transistor described in the brochure entitled "IGBT Designer's Manual" by International Rectifier, pages 85–87, date unknown, requires a voltage of at least 12V in order to ensure normal operation. If the voltage of the driving signal between the gate and emitter is too low, then the impedance between the collector and emitter becomes too large, causing a sudden increase in switch heat loss and burnout, thereby limiting low voltage applications. Other conventional insulated-gate bipolar transistors (IGBTs) similarly limit the driving signal to a voltage of not lower than 12V.

BRIEF DESCRIPTION OF THE DRAWINGS

The FIGURE is a basic circuit block diagram of the invention.

SUMMARY OF THE INVENTION

A photoelectric transducer driven insulated-gate bipolar transistor (IGBT) includes a photoelectric illumination component supplied with low voltage electric power to convert the low voltage electric power into light energy, the illumination component being in the form of an LED, electric bulbs, or the like, coupled with a photoelectric transducer component made up of crystal series or non-crystal series photoelectric cells, or the like, to generate high voltage, small current signals and supply them to the gate electrode and emitter electrode of an insulated-gate bipolar transistor (IGBT), thereby allowing an insulated-gate bipolar transistor (IGBT) driven by a low voltage signal source to work normally.

DETAILED DESCRIPTION OF THE PREFERRED EMBODIMENTS

The FIGURE is a basic circuit block diagram of a pre-positioned photoelectric transducer driven insulated-gate bipolar transistor according to a preferred embodiment of the invention, which includes the following elements:

An insulated-gate bipolar transistor set Q101 made up of a single uni-polar unit, two units of opposite polarities, or other various bridge module structures, to which are matched a number of photoelectric transducers equal to the number of insulated-gate bipolar transistors (IGBTs);

A photoelectric transducer component PE101 including the above-mentioned photoelectric transducers constituted by a crystal series or a non-crystal series photoelectric cell for converting light energy into electric power, or other types of components which convert light energy into electric power, for supplying a driving voltage higher than the lowest required by the insulated-gate bipolar transistors when in a normal light receiving status;

An illuminating component L101 for converting low voltage electric power into light energy, including by way of example a light emitting diode (LED), an incandescent electric light bulb, etc., the term "low" voltage being defined to be a voltage lower than the lowest required driving voltage of the insulated-gate bipolar transistor (IGBT), with the ratio of photoelectric transducers in component PE101 to the number of illumination elements being one to one, or with one light emitting diode LED or the like being employed to drive two or more than two photoelectric transducers in component PE101 simultaneously;

A load 101, which may be any of a variety of loads such as the mechanical energy generated by electric power, light, heat or electrochemical effect, or other resistive, capacitive or inductive loads.

By combinations of the aforesaid components, the photoelectric transducer component which can generate a high voltage and small current at normal light receiving status is installed in parallel between the gate electrode and emitter electrode of the insulated-gate bipolar transistor, and the low voltage, electric power to light energy converting illumination component is coupled with the photoelectric transducer component, so that when the low voltage, electric power to light energy converting illumination components are illuminated, the photoelectric transducer component PE101 is excited to generate a corresponding high voltage, small current driving signal to drive the insulated-gate bipolar transducer (IGBT).

The aforesaid low voltage, electric power to light energy converting illumination component L101 and the photoelectric transducer component PE101 can be embodied in a mutually coupled sealed structure as required.

Alternatively, the aforesaid low voltage, electric power to light energy converting illumination component L101 and the photoelectric transducer component PE101 can be separately installed, or embodied in an integral module package.

The aforesaid low voltage electric power source can be a DC or AC current for driving an electric light bulb, or DC power for driving an electric light bulb, or DC power for driving a light emitting diode, or other power supply types can be used to excite the illuminating components.

In addition, the aforesaid low voltage power driven electric bulb, light emitting diode, or other illuminating components driven by low voltage electric power can be replaced by a natural light source.

In summary, the pre-positioned photoelectric transducer driven insulated-gate bipolar transistor (IGBT) of the preferred embodiment utilizes a low voltage electric power to light energy converting illumination component coupled with a photoelectric transducer component to generate a high voltage and small current, enabling the insulated-gate bipolar transistor to be operated using a low voltage driving signal source input.

I claim:

1. A driving circuit arrangement for an insulated gate bipolar transistor, comprising:

a photoelectric transducer component arranged to supply a high voltage, small current driving signal to the insulated-gate bipolar transistor, said high voltage being higher than a lowest required driving voltage of the insulated-gate bipolar transistor; and a low voltage illumination component optically coupled with the photoelectric transducer component and arranged to convert a low voltage into light energy, said low voltage being lower than said high voltage, wherein when the low voltage illumination component is illuminated, light energy is transferred from said low voltage illumination component to said photoelectric transducer component, said light energy causing the photoelectric transducer component to generate said high voltage, small current driving signal and to supply said high voltage, small current driving signal to the insulated-gate bipolar transducer.

2. An arrangement as claimed in claim 1, wherein the illumination component is an LED, and the photoelectric illumination component includes at least one photoelectric transducer cell.

3. An arrangement as claimed in claim 1, wherein the illumination component is an incandescent bulb, and the photoelectric illumination component includes at least one photoelectric transducer cell.

4. An arrangement as claimed in claim 1, wherein the photoelectric transducer component is electrically connected between a gate electrode and an emitter electrode of the insulated gate bipolar transistor.

5. An arrangement as claimed in claim 1, wherein the low voltage is a voltage lower than said lowest required driving voltage of the insulated-gate bipolar transistor.

6. An arrangement as claimed in claim 1, wherein said illumination component and said photoelectric transducer component are mounted within a sealed structure.

7. An arrangement as claimed in claim 1, wherein said illumination component, said photoelectric transducer component are separately installed components.

8. An arrangement as claimed in claim 1, wherein said illumination component and said photoelectric transducer component are installed together with said insulated gate bipolar transducer as an integral module package.

9. A driving circuit arrangement for an insulated gate bipolar transistor, comprising:

a photoelectric transducer component electrically connected between a gate electrode and an emitter electrode of the insulated gate bipolar transistor and arranged to supply a high voltage, small current driving signal to the insulated-gate bipolar transistor, said high voltage being higher than a lowest required driving voltage of the insulated-gate bipolar transistor; and an illumination component optically coupled with the photoelectric transducer component, wherein when the illumination component is illuminated, light energy is transferred from said illumination component to said photoelectric transducer component, said light energy causing the photoelectric transducer component to generate said high voltage, small current driving signal and to supply said high voltage, small current driving signal to the insulated-gate bipolar transducer.

10. An arrangement as claimed in claim 9, wherein the illumination component is a natural light source.

* * * * *